United States Patent [19]
Kim et al.

[11] Patent Number: 5,963,798
[45] Date of Patent: *Oct. 5, 1999

[54] FABRICATION METHOD OF CMOS DEVICE HAVING BURIED IMPLANTED LAYERS FOR LATERAL ISOLATION (BILLI)

[75] Inventors: Kwang-Soo Kim, Kyoungki-do; Kyung-Dong Yoo, Seoul, both of Rep. of Korea

[73] Assignee: Hyundai Electronics Industries Co., Ltd., Kyoungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/882,485

[22] Filed: Jun. 25, 1997

[30] Foreign Application Priority Data

Jun. 29, 1996 [KR] Rep. of Korea ...................... 96-26303

[51] Int. Cl.[6] .............................................. H01L 21/8238
[52] U.S. Cl. .......................... 438/199; 438/217; 438/220; 438/370; 438/373; 438/420; 438/526; 438/529; 148/DIG. 70; 257/369
[58] Field of Search .................................... 438/199, 526, 438/529, FOR 160, FOR 168, FOR 216, FOR 217, FOR 218, 217, 220, 370, 373, 420; 148/DIG. 70; 257/370, 369

[56] References Cited

U.S. PATENT DOCUMENTS

| | | |
|---|---|---|
| 4,810,664 | 3/1989 | Kamins et al. ............................ 437/26 |
| 5,096,841 | 3/1992 | Miura et al. ............................. 438/526 |
| 5,160,996 | 11/1992 | Odanaka ................................. 257/375 |
| 5,292,671 | 3/1994 | Odanaka ................................... 437/29 |
| 5,384,279 | 1/1995 | Stolmeijer et al. ....................... 437/57 |
| 5,501,993 | 3/1996 | Borland .................................... 437/34 |

FOREIGN PATENT DOCUMENTS

| | | |
|---|---|---|
| 0336977 | 4/1989 | European Pat. Off. . |
| 357064962 | 4/1982 | Japan ........................... 438/FOR 216 |

*Primary Examiner*—Peter Toby Brown
*Assistant Examiner*—Long Pham
*Attorney, Agent, or Firm*—Ware, Fressola, Van Der Sluys & Adolphson LLP

[57] ABSTRACT

A method for fabricating a CMOS device having BILLI (buried implanted layers for lateral isolation) structure capable of effectively preventing latch-up is disclosed, having the following steps. A mask pattern is formed on the semiconductor substrate of a predetermined conductivity type to expose a region where the MOS transistor, having a same conductivity type as that of the substrate, is to be formed wherein the mask pattern has a vertical boundary face having a gradual slope. A buried layer is then formed in the form of island by ion-implanting the impurity ions into the substrate to pass through the mask pattern, the buried layer having a same conductivity type as that of the substrate, and being formed to be continuous under the vertical boundary face of the mask pattern.

5 Claims, 3 Drawing Sheets

FABRICATION METHOD OF CMOS DEVICE HAVING BURIED IMPLANTED LAYERS FOR LATERAL ISOLATION (BILLI)

BACKGROUND OF THE INVENTION

1. Field of the Invention

The present invention relates to a fabrication method of CMOS device, and more particularly, to a method for fabricating a CMOS device having BILLI (buried implanted layers for lateral isolation) structure capable of effectively preventing latch-up.

2. Description of Related Art

A complementary MOS (CMOS) device consists of an N channel MOS (NMOS) transistor and a P channel MOS (PMOS) transistor. The drains of the NMOS transistor and of PMOS transistor are connected to each other, and the transistors selectively operate according to the voltage applied to each gate. The CMOS device has advantages of lower power consumption than a single device such as NMOS or PMOS transistor because of the small DC voltage existing between power supply terminals. Therefore, the CMOS device is applied to a low power devices as well as to high speed and high integration devices.

In the CMOS device, however, NMOS and PMOS transistor are formed on a semiconductor substrate thereby forming parasitic bipolar transistors. These parasitic bipolar transistors cause a latch-up phenomenon to occur when the CMOS device is operated, and in the worst case, latch-up results in permanent damage or operational failure.

Consequently, a BILLI (buried implanted layers for lateral isolation) structure is disclosed for the purpose of preventing the latch-up caused in the conventional CMOS device.

A method for manufacturing CMOS device with BILLI structure will be described with reference to FIGS. 1A to 1C.

As illustrated in FIG. 1A, a first mask pattern 2 is formed on a P-type semiconductor substrate 1 to expose an area where a PMOS will be later formed. A N-well impurity region 3 is then formed in the form of an island in the substrate 1 by ion-implanting using the first mask pattern 2. A punch-stop impurity region 4 for use in PMOS is formed in the form of an island in the substrate 1 wherein its depth is shallower than that of the N-well impurity region 3. A threshold voltage adjust impurity region 5 for use in PMOS is formed near the form of island in the surface of the substrate 1 wherein its depth is shallower than that of the punch stop impurity region 4 for use in PMOS.

As illustrated in FIG. 1B, a P-type buried layer 6 of a high concentration is formed in the form of an island deep in the substrate 1 by ion-implanting at a relatively high energy level. Here, the P-type buried layer 6 has portions, 6a and 6b, wherein the second portion of the P-type buried layer 6b has a step difference from the first portion 6a equal to the thickness of the first mask pattern 2, the step difference in the P-type buried layer 6 being a result of using the first mask pattern 2 during ion-implantation. The P-type buried layer 6 functions as P-well during the device's operation, and the N-well is separated from the P well, thereby preventing the latch-up in the CMOS device.

As illustrated in FIG. 1C, the first mask pattern 2 is removed. A second mask pattern 7 is then formed on the substrate 1 to expose the region where NMOS will be later formed. A punch-stop impurity region 8 and a threshold adjust impurity region 9 for use in NMOS are sequentially formed in the form of islands in the substrate 1 by ion-implanting using the second mask pattern 7. The second mask pattern 7 is then removed (not shown), and the CMOS device is manufactured with a conventional follow-up processes.

In the above-described CMOS device with BILLI structure, however, the first mask pattern 2 has a steep vertical boundary face aligned perpendicular to the substrate. There is a short coming in that the boundary face of the first mask pattern negatively affects the formation of the P-type buried layer 6 wherein during ion-implanting using the above first mask pattern 2, the P-type buried layer 6 is divided and formed separately as two separate islands as shown in FIGS. 1B & 1C, as opposed to a desired continuous formation as indicated by the dotted lines. As a result, because a continuous formation is not achieved, it is difficult to prevent the latch-up in this case.

SUMMARY OF THE INVENTION

Accordingly, an object of the present invention is to provide a method for fabricating a CMOS device which can effectively prevent a latch-up.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating CMOS device having BILLI structure of the invention includes the steps of: forming a mask pattern on the semiconductor substrate of a predetermined conductivity type to expose the region where a MOS transistor of which conductivity type is the same as that of the substrate is to be formed, the mask pattern having a vertical boundary face with a gradual slope; and forming a buried layer in the form of an island by ion-implanting the impurity ions into the substrate to pass through the mask pattern, the impurity ions having a conductivity type that is the same as that of substrate.

In this embodiment, the buried layer is formed to be continuous under the vertical boundary face of the mask pattern.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Embodiments according to the present invention is described below with reference the attached drawings.

Figure 1A:
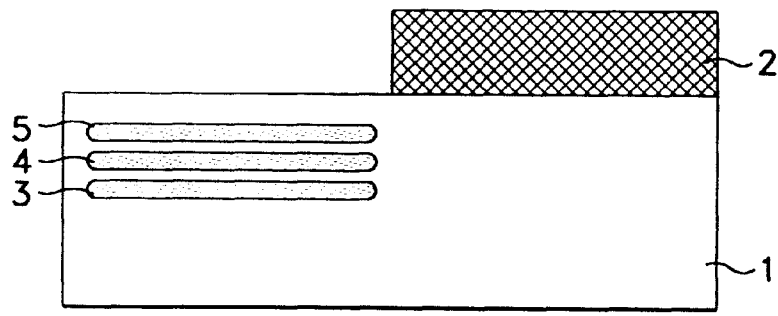
FIGS. 1A to 1C are sectional views illustrating the fabrication process of the BILLI structure of a conventional CMOS device.
Figure 1B:
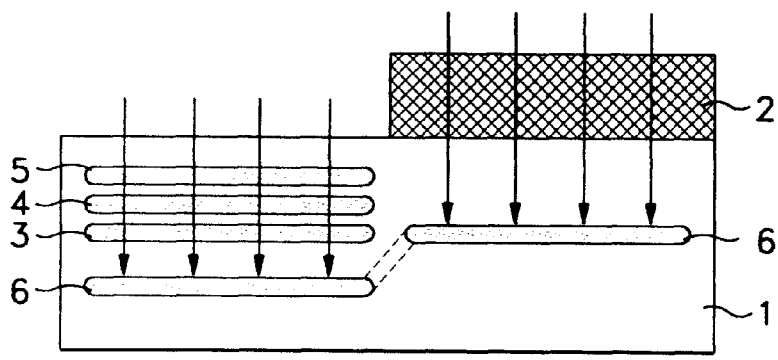
Figure 1C:
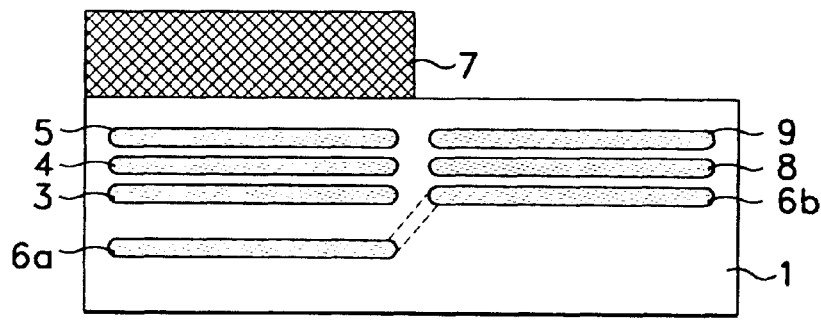
Figure 2A:
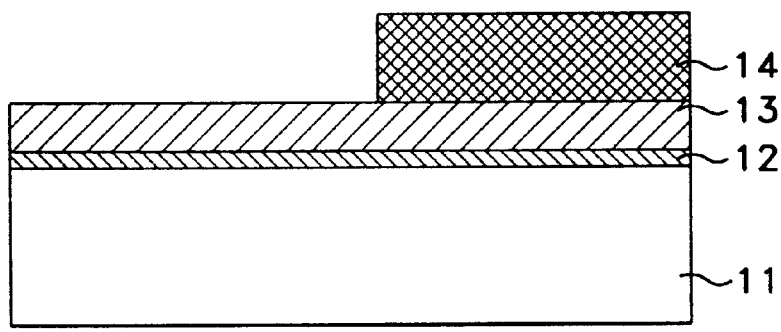
FIGS. 2A to 2E are sectional views illustrating the fabrication procedures of the BILLI structure of a CMOS device according to one embodiment of the present invention.

As illustrated in FIG. 2A, a first oxide layer 12 and a first polysilicon layer 13 are sequentially formed on a P-type semiconductor substrate 11. A first mask pattern 14 is formed on the first polysilicon layer 13 to expose the region where a PMOS is to be formed later on. Here, the first oxide layer 12 and the first polysilicon layer 13 are formed to a sufficient thickness so as to hinder impurity ions during the ion-implanting in the formation of a N-well. Additionally, a nitride layer can be used instead of the first polysilicon layer 13.

Figure 2B:
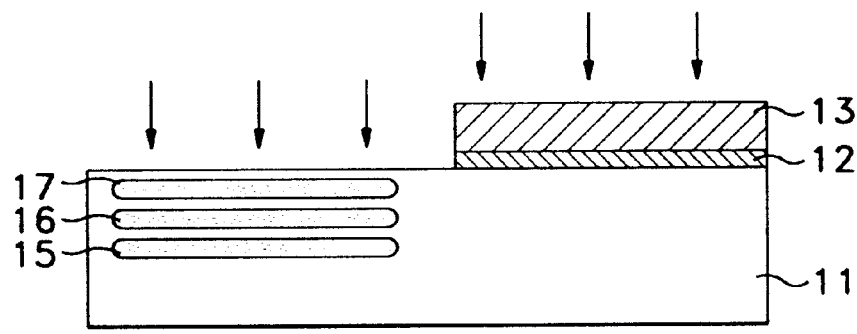

As illustrated in FIG. 2B, the first polysilicon layer 13 and the first oxide layer 12 are etched and patterned, using the first mask pattern 14 as an etch mask, and the first mask pattern 14 is then removed by a well-known method. N-type impurity ions are implanted into the substrate 11, by ion-implanting using the patterned first polysilicon layer 13 and first oxide layer 12 as the mask, thereby forming a N-well impurity region 15 in the form of an island. Next, N-type impurity ions, preferably P ions, are implanted again into the substrate 11, to form a punch-stop impurity region 16 in the form of an island for use in the PMOS wherein its depth is formed to be shallower than that of the N-well impurity region 15. Afterwards, N-type impurity ions, preferably P ions, are implanted once more into the substrate of the substrate 11, so that a threshold voltage adjustment impurity region 17 is formed in the form of an island for use in PMOS wherein the threshold voltage adjustment impurity region 17 is arranged above the punch-stop impurity region 16.

Figure 2C:
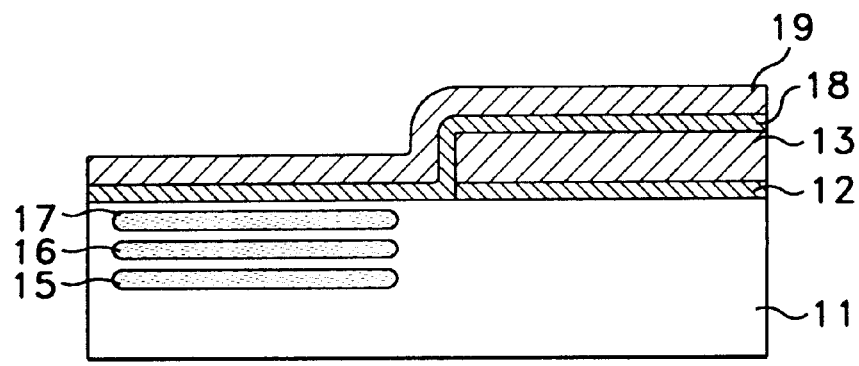

As illustrated in FIG. 2C, a second oxide layer 18 and a second polysilicon layer 19 are sequentially formed on the structure of FIG. 2B. Here, a nitride layer can be used instead of the second polysilicon layer 19.

Figure 2D:
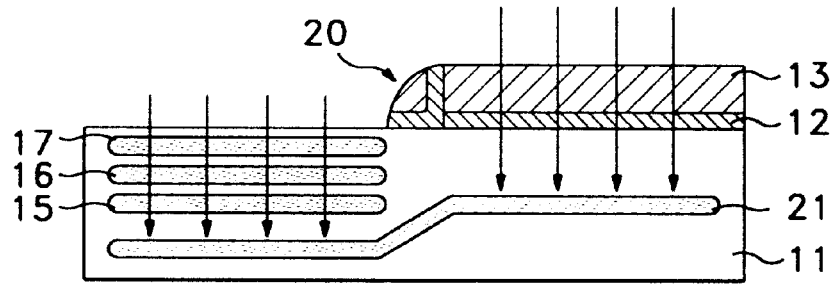

As illustrated in FIG. 2D, the second polysilicon layer 19 and the second oxide layer 18 are anisotropically blanket-etched to expose the surface of the first polysilicon layer 13, wherein a spacer 20 is formed from the second oxide layer 18 and second polysilicon layer 19 on the side wall of the first oxide layer 12 and the first polysilicon layer 13. In addition, the spacer 20 is formed such it has a gradual slope. Thereafter, high concentration P type impurity ions, preferably B ions, are implanted into the substrate 1 at a considerably high energy, using the first oxide layer 12, first polysilicon layer 13 and a spacer 20 as an ion-implanting mask, so that a P-type buried layer 21 of high concentration is formed in the form of an island. Herein, as shown in FIG. 2D, the P-type buried layer 21 is formed such that a portion is arranged below the N-well impurity region 15, while another portion of the P-type buried layer 21 is arranged at an equal depth to have a step difference from the first portion equal to the thickness of the first oxide layer 12 and first polysilicon layer 13 of the ion-implanting mask. Due to the gradual slope of the spacer 20 of the ion-implanting mask, a middle portion of the P-type buried layer 21, located below the spacer 20, is sloped to connect the two aforementioned portions of the P-type buried layer 21 such that the P-type buried layer 21 is formed to be continuous without any gaps or points of division. Accordingly, the P-type buried layer 21 is formed to surround the N-well impurity region 15 to its bottom and side wherein the N-well impurity region 15 and P-type buried layer 21 are arranged apart from each other. Thus, occurrence of latch-up phenomenon is effectively prevented.

Figure 2E:
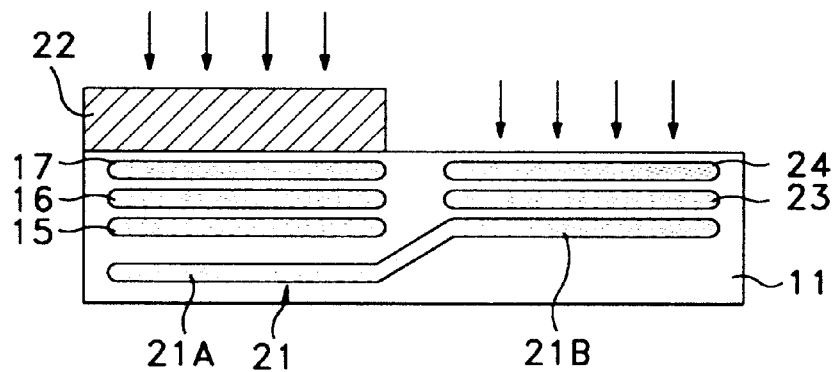

As illustrated in FIG. 2E, the first oxide layer 12, the first polysilicon layer 13 and the spacer 20, forming the ion-implanting mask, are removed. A second mask pattern 22 is then formed on the substrate 11 to expose the region where a NMOS is to be formed. A punch-stop impurity region 23 for use in NMOS is then formed in the form of an island in the substrate 11 by ion-implanting using the second mask pattern 22. Here, the punch-stop impurity region 23 is arranged above the P-type buried layer 21 of high concentration, its depth being shallower than that of the P-type buried layer 21. Next, a threshold voltage adjustment impurity region 24 for use in NMOS is formed in the form of an island near the surface of the substrates 11, and arranged to above the punch-stop impurity region 23. Thereafter, the second mask pattern 22 is removed (not shown), and following-up processes are performed to form the PMOS and NMOS transistors to thereby manufacture a CMOS transistor.

Meanwhile, BILLI structure of the P type buried layer of high concentration can be formed former to the N well impurity region, punch-stop impurity region for use in the PMOS and threshold voltage adjustment impurity region for use in the PMOS.

In addition, in above-described embodiment of the invention, the ion-implanting mask pattern in case of forming the buried layer is formed with a vertical boundary having a gentle slope by the spacer made of the oxide layer and polysilicon layer. This mask pattern, however, can be formed in through an alternative method as described below.

Figure 3:
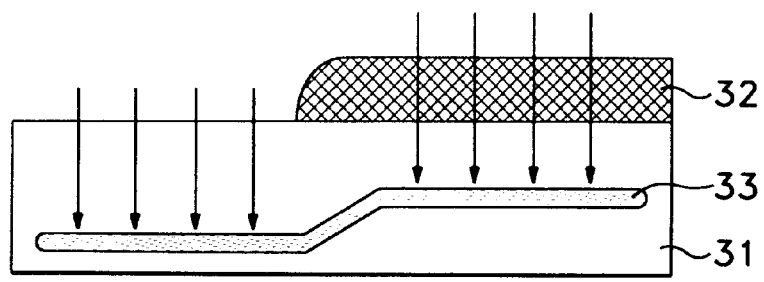
FIG. 3 is a sectional view illustrating the BILLI structure of a CMOS device according to another embodiment of the present invention.

FIG. 3 schematically illustrates the section of the BILLI structure of CMOS transistor according to another embodiment of the invention. Here, an ion-implanting mask pattern is formed as a photoresist layer having a vertical boundary slope that is made to be gradual be means of a thermal process.

As illustrated in FIG. 3, a photoresist layer pattern 32 is formed by a photolithography process on the P-type semiconductor substrate 31 to expose the region where the PMOS is to be formed. Thereafter, the photoresist layer pattern 32 is flowed by the thermal process, such that a slope of its vertical side boundary is made to be gradual. The thermal process is performed at a temperature of 100 to 200° C. P-type impurity ions of high concentration are deeply implanted into the substrate 31 by ion-implantation at high energy using the photoresist layer pattern 32 as ion-implanting mask, so that a P-type buried layer 33 of high concentration is formed in the substrate 31. The P-type buried layer 33 being formed to have the same continuous shape as described in the previous embodiment, wherein the P-type buried layer 33 is sloped under the vertical boundary face of the photoresist layer pattern.

In forming the BILLI structure according to the above described invention, the vertical boundary face of the ion-implanting mask pattern is formed to have a gradual slope, an the ion-implantation is accordingly performed along the gradual vertical boundary face thereby continually forming the buried layer under the vertical boundary face of the mask pattern. Accordingly, the P-type buried layer is formed to surround the N-well to its bottom and side wherein the N-well and P-type buried layer are arranged apart from each other. Thus, occurrence of latch-up phenomenon is effectively prevented, thereby improving the characteristic of the CMOS device.

It will be apparent to those skilled in the art that various modifications and variations can be made in the fabricating method of CMOS device of the present invention without departing from the spirit or scope of the invention. Thus, it is intended that the present invention cover the modifications and variations of this invention provided they come within the scope of the appended claims and their equivalents.

What is claimed is:

1. A method for fabricating a CMOS device with BILLI structure comprising the steps of:

sequentially forming a first layer and a second layer on a semiconductor substrate of a first conductivity type;

patterning the first and second layers to expose a region where a MOS transistor of the first conductivity type is to be formed;

sequentially forming a third layer which is of the same material as the first layer, and a fourth layer which is of the same material as the second layer on the substrate;

blanket-etching the third and fourth layers to form a spacer made of the third and the fourth layers on the side wall of the first and second layers, thereby forming a mask pattern having a vertical boundary face with a gradual slope; and ion-implanting impurity ions of the first conductivity type into the substrate to form a buried layer in a form of an island within the substrate, wherein the buried layer is continuous under the vertical boundary face of the mask pattern.

2. The method of fabricating CMOS device as claimed in claim 1, wherein the first layer is an oxide layer and the second layer is a polysilicon layer.

3. The method of fabricating CMOS device as claimed in claim 1, wherein the first layer is an oxide layer and the second layer is a nitride layer.

4. A method for fabricating a CMOS device with BILLI structure, comprising the steps of:

forming a photoresist layer on a semiconductor substrate of a first conductivity type;

patterning the photoresist layer to expose a region where a MOS transistor of the first conductivity type is to be formed;

thermal processing the patterned photoresist layer to form a mask pattern having a vertical boundary face with a gradual slope; and ion-implanting impurity ions of the first conductivity type into the substrate to form a buried layer in a form of an island within the substrate, wherein the buried layer is continuous under the vertical boundary face of the mask pattern.

5. The method of fabricating CMOS device as claimed in claim 4, wherein the thermal process is performed at a temperature of 100 to 200° C.

* * * * *